United States Patent
Hall et al.

(10) Patent No.: US 8,049,340 B2
(45) Date of Patent: Nov. 1, 2011

(54) DEVICE FOR AVOIDING PARASITIC CAPACITANCE IN AN INTEGRATED CIRCUIT PACKAGE

(75) Inventors: Jeffrey Hall, San Jose, CA (US); Shawn Nikoukary, Santa Clara, CA (US); Amar Amin, Milpitas, CA (US); Michael Jenkins, San Jose, CA (US)

(73) Assignee: LSI Corporation, Milpitas, CA (US)

( * ) Notice: Subject to any disclaimer, the term of this patent is extended or adjusted under 35 U.S.C. 154(b) by 365 days.

(21) Appl. No.: 11/277,188

(22) Filed: Mar. 22, 2006

(65) Prior Publication Data

US 2007/0222084 A1    Sep. 27, 2007

(51) Int. Cl.
*H01L 23/48* (2006.01)
(52) U.S. Cl. ......... 257/777; 257/E23.019; 257/E23.151; 257/758
(58) Field of Classification Search ........... 257/792, 257/777, 700, 798, 728, E23.019, E23.151, 257/E23.152, E23.153, E23.175, 758, 693, 257/698, 760, 691, 692, E23.062, 778
See application file for complete search history.

(56) References Cited

U.S. PATENT DOCUMENTS

| | | | | |
|---|---|---|---|---|
| 6,075,700 A * | 6/2000 | Houghton et al. | ............ | 361/704 |
| 6,392,301 B1 * | 5/2002 | Waizman et al. | ............ | 257/774 |
| 6,397,375 B1 * | 5/2002 | Block et al. | .................... | 716/127 |
| 6,430,030 B1 * | 8/2002 | Farooq et al. | ............ | 361/321.2 |
| 6,872,921 B1 * | 3/2005 | DeCobert et al. | ............ | 219/441 |
| 6,875,921 B1 * | 4/2005 | Conn | ............................. | 174/534 |
| 7,358,609 B2 * | 4/2008 | Iguchi et al. | .................. | 257/758 |
| 2002/0027282 A1 * | 3/2002 | Kawakami et al. | ........... | 257/700 |
| 2002/0043715 A1 * | 4/2002 | Takizawa | ........................ | 257/700 |
| 2004/0021218 A1 * | 2/2004 | Hayama et al. | ............... | 257/700 |
| 2004/0227227 A1 * | 11/2004 | Imanaka et al. | ............. | 257/700 |
| 2005/0037601 A1 * | 2/2005 | Hsu et al. | ...................... | 438/612 |
| 2005/0200022 A1 * | 9/2005 | Seto | .............................. | 257/758 |
| 2006/0261459 A1 * | 11/2006 | Lin et al. | ...................... | 257/685 |

* cited by examiner

*Primary Examiner* — Wael Fahmy
*Assistant Examiner* — Sarah Salerno
(74) *Attorney, Agent, or Firm* — Otterstedt, Ellenbogen & Kammer, LLP

(57) ABSTRACT

An integrated circuit package substrate includes a first and an additional electrically conductive layer separated from each other by an electrically insulating layer, a contact pad formed in the first electrically conductive layer for making a direct connection between the integrated circuit package substrate and a printed circuit board, and a cutout formed in the additional electrically conductive layer wherein the cutout encloses an area that completely surrounds the contact pad for avoiding parasitic capacitance between the additional electrically conductive layer and the printed circuit board.

19 Claims, 6 Drawing Sheets

DEVICE FOR AVOIDING PARASITIC CAPACITANCE IN AN INTEGRATED CIRCUIT PACKAGE

BACKGROUND OF THE INVENTION

1. Field of the Invention

The present invention is directed to the design and manufacture of integrated circuits. More specifically, but without limitation thereto, the present invention is directed to the design of an integrated circuit package that minimizes parasitic capacitance between metal layers in a ball grid array integrated circuit package.

2. Description of Related Art

An integrated circuit package commonly includes several electrically conductive planar layers separated from one another by electrically insulating layers. Connections between the electrically conductive layers, typically metal layers, are made by forming vias in the electrically insulating layers, typically dielectric layers, and depositing an electrically conductive material in the vias, such as copper. Circuits are formed in the metal layers by etching away a portion of the metal, for example, to form traces in routing metal layers and contacts in contact pad metal layers. The contact pads are used to make electrical connection between the integrated circuit package and a printed circuit board. Some metal layers in the integrated circuit package are used to conduct a voltage supply and others to conduct a ground return to the routing metal layers and the contact pad metal layers.

SUMMARY OF THE INVENTION

In one embodiment, an integrated circuit package substrate includes:

a first and an additional electrically conductive layer separated from each other by an electrically insulating layer;

a contact pad formed in the first electrically conductive layer for making a direct connection between the integrated circuit package substrate and a printed circuit board; and a cutout formed in the additional electrically conductive layer wherein the cutout encloses an area that completely surrounds the contact pad for avoiding parasitic capacitance between the additional electrically conductive layer and the printed circuit board.

In another embodiment, a method includes steps of:

(a) forming a first and an additional electrically conductive layer separated from each other by an electrically insulating layer in an integrated circuit package substrate;

(b) forming a contact pad in the first electrically conductive layer for making a direct connection between the integrated circuit package substrate and a printed circuit board; and (c) forming a cutout in the additional electrically conductive layer wherein the cutout encloses an area that completely covers the contact pad for avoiding parasitic capacitance between the additional electrically conductive layer and the printed circuit board.

BRIEF DESCRIPTION OF THE DRAWINGS

The above and other aspects, features and advantages will become more apparent from the description in conjunction with the following drawings presented by way of example and not limitation, wherein like references indicate similar elements throughout the several views of the drawings, and wherein.

Elements in the figures are illustrated for simplicity and clarity and have not necessarily been drawn to scale. For example, the dimensions, sizing, and/or relative placement of some of the elements in the figures may be exaggerated relative to other elements to clarify distinctive features of the illustrated embodiments. Also, common but well-understood elements that may be useful or necessary in a commercially feasible embodiment are often not depicted in order to facilitate a less obstructed view of the illustrated embodiments.

DESCRIPTION OF THE ILLUSTRATED EMBODIMENTS

The following description is not to be taken in a limiting sense, rather for the purpose of describing by specific examples the general principles that are incorporated into the illustrated embodiments. For example, certain actions or steps may be described or depicted in a specific order to be performed. However, practitioners of the art will understand that the specific order is only given by way of example and that the specific order does not exclude performing the described steps in another order to achieve substantially the same result. Also, the terms and expressions used in the description have the ordinary meanings accorded to such terms and expressions in the corresponding respective areas of inquiry and study except where other meanings have been specifically set forth herein.

In integrated circuits such as serializer/deserializer (SERDES) devices that convert a serial data stream to or from a parallel data stream, high data transfer rates may require fast switching speeds that surpass 1 GHz. At such high frequencies, the parasitic capacitance between transmit (Tx) and receive (Rx) contact pads in the contact pad layer and nearby metal layers of the integrated circuit package may result in a deterioration of the signal waveform and a correspondingly reduced circuit performance.

Figure 1:
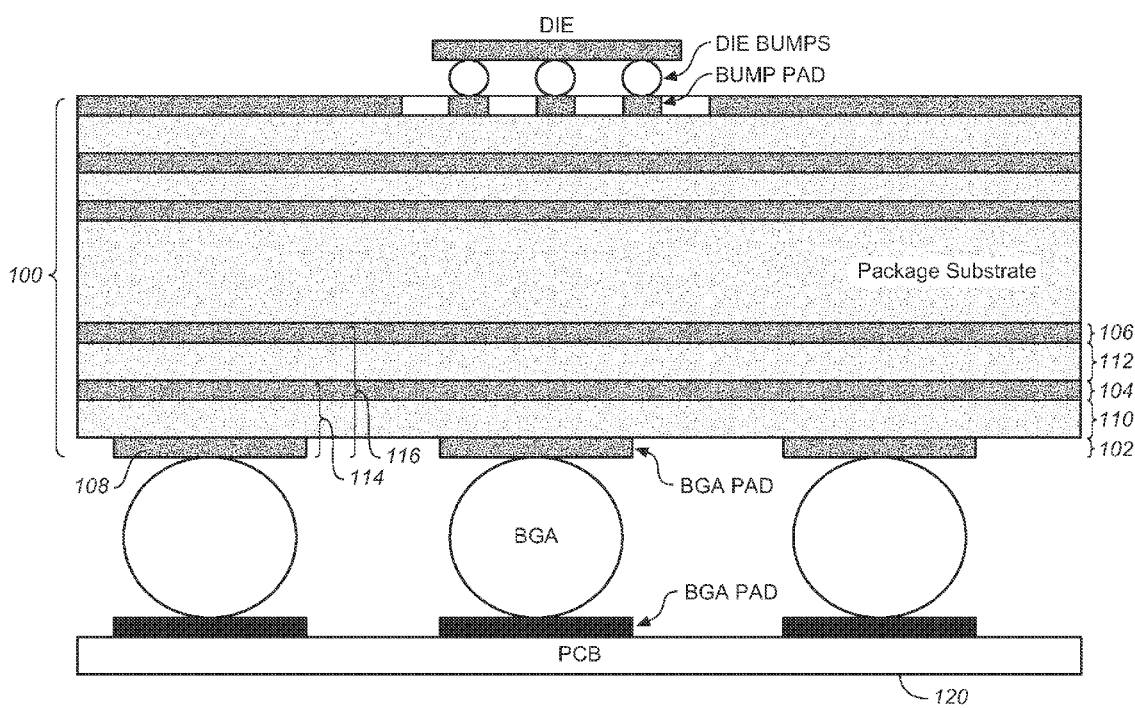
FIG. 1 illustrates a simplified partial side view of a typical ball grid array (BGA) integrated circuit package substrate of the prior art.

FIG. 1 illustrates a simplified partial side view of a typical ball grid array (BGA) integrated circuit package substrate 100 of the prior art. Shown in FIG. 1 are a contact pad metal layer 102, a routing metal layer 104, a ground return metal layer 106, a ball pad 108, dielectric layers 110 and 112, parasitic capacitances 114 and 116, and a printed circuit board 120.

In the example of FIG. 1, the contact pad metal layer 102, the routing metal layer 104, and the ground return metal layer 106 are electrically conductive layers made of, for example, copper or copper alloy. The dielectric layers 110 and 112 are electrically insulating layers made of, for example, an epoxy compound. The ball pad 108 is formed in the contact pad metal layer 102 to connect the integrated circuit package substrate 100 to the printed circuit board 120, typically by vias (not shown). Vias are holes in the dielectric layers 110 and 112 that are filled with an electrically conductive material, such as copper, to make electrical connections between the contact pad metal layer 102, the routing metal layer 104, and the ground return metal layer 106.

Metal layers that have a relatively large metal area may produce significant parasitic capacitance. For example, the parasitic capacitance 114 between the ball pad 108 and the routing metal layer 104 and the parasitic capacitance 116 between the underlying ball pad 108 and the ground return metal layer 106 have been found by the inventors to produce distortion of the switching waveform of high-frequency signals used, for example, in serializing/deserializing devices (SERDES). As a result, the maximum operating frequency that may be used in the integrated circuit is disadvantageously limited by the parasitic capacitances 114 and 116 in the integrated circuit package substrate 100.

Figure 2:
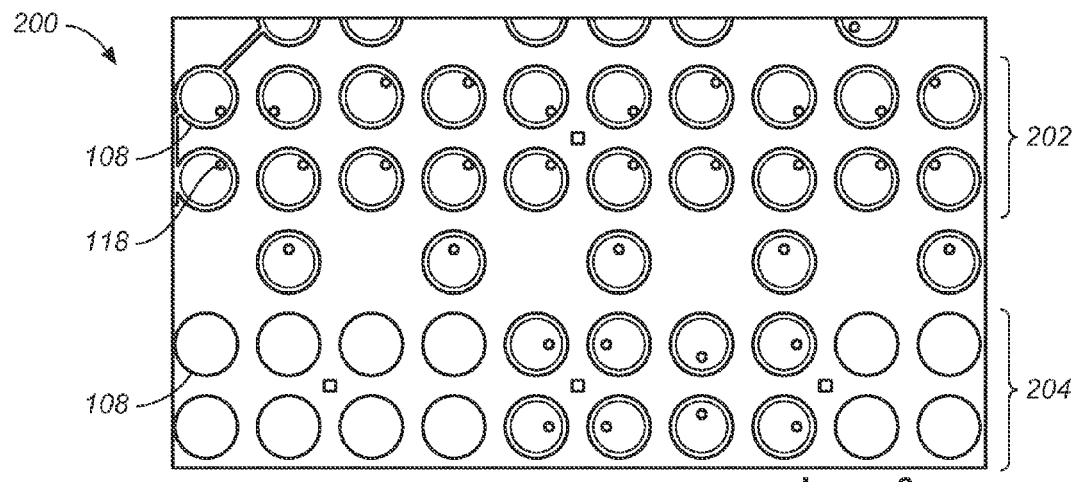
FIG. 2 illustrates a top view of the contact pad metal layer in the integrated circuit package substrate of FIG. 1.

FIG. 2 illustrates a top view 200 of the contact pad metal layer 102 in the integrated circuit package substrate of FIG. 1. Shown in FIG. 2 are ball pads 108, vias 118, transmit (Tx) rows 202, and receive (Rx) rows 204.

In FIG. 2, the ball pads 108 included in the transmit (Tx) rows 202 and the receive (Rx) rows 204 are typically driven by high-frequency signals in excess of 1 GHz.

Figure 3:
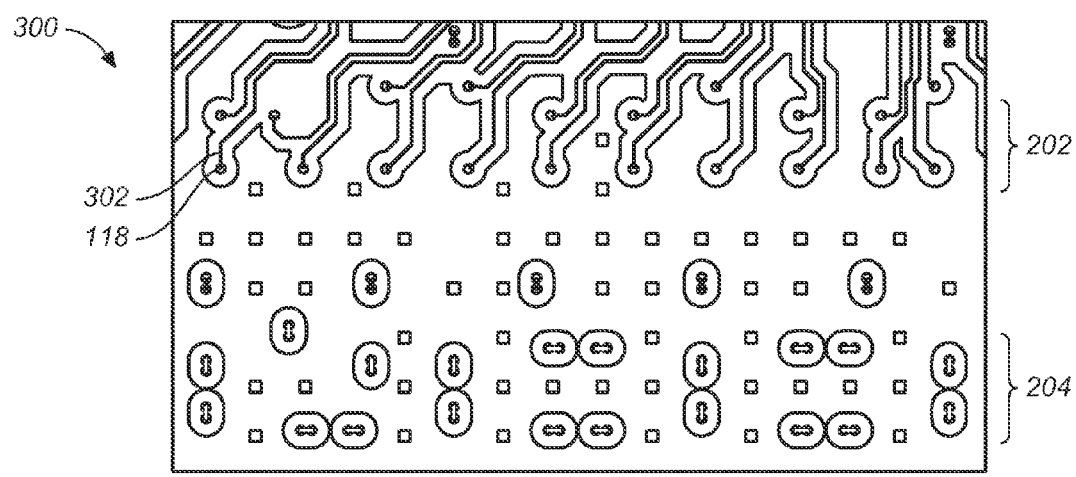
FIG. 3 illustrates a top view of the routing metal layer in the integrated circuit package substrate of FIG. 1.

FIG. 3 illustrates a top view 300 of the routing metal layer 104 in the integrated circuit package substrate of FIG. 1. Shown in FIG. 3 are vias 118, transmit (Tx) rows 202, receive (Rx) rows 204, and routing traces 302.

In FIG. 3, the vias 118 connect the ball pads 108 in the contact pad metal layer 102 in FIG. 1 to the routing traces 302. Some of the metal in the routing metal layer 104 is removed around the routing traces 302; however, the area of the ball pads 108 in FIG. 1 constituting the transmit (Tx) rows 202 and the (Rx) rows 204 in FIG. 2 still overlaps the metal substantially in the routing metal layer 104, resulting in the parasitic capacitance 114 between the contact pad metal layer 102 and the routing metal layer 104 in FIG. 1.

Figure 4:
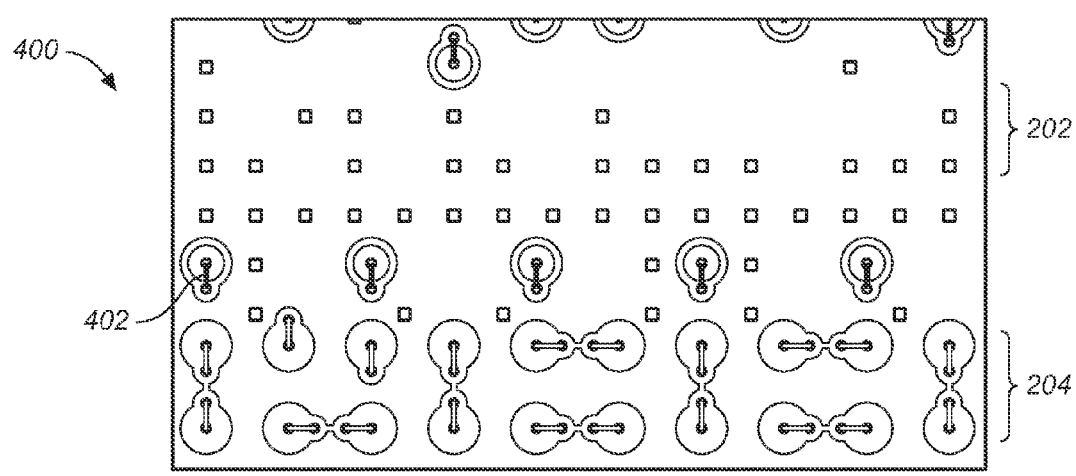
FIG. 4 illustrates a top view of the ground return metal layer in the integrated circuit package substrate of FIG. 1.

FIG. 4 illustrates a top view 400 of the ground return metal layer 106 in the integrated circuit package substrate of FIG. 1. Shown in FIG. 4 are transmit (Tx) rows 202, receive (Rx) rows 204, and routing traces 402.

In FIG. 4, Some of the metal in the routing metal layer 104 is removed around the routing traces 402; however, the area of the ball pads 108 in FIG. 1 constituting the transmit (Tx) rows 202 and the receive (Rx) rows 204 in FIG. 2 still overlaps the metal substantially in the routing metal layer 106, resulting in the parasitic capacitance 116 between the contact pad metal layer 102 and the ground return metal layer 106 in FIG. 1.

The parasitic capacitance between the contact pads in the contact pad metal layer 102 and other nearby metal layers of the integrated circuit package substrate may be advantageously avoided by forming cutouts in each of the other metal layers to enclose an area that surrounds each of the contact pads as described below.

In one embodiment, an integrated circuit package substrate includes:

a first and an additional electrically conductive layer separated from each other by an electrically insulating layer;

a contact pad formed in the first electrically conductive layer for making a direct connection between the integrated circuit package substrate and a printed circuit board; and a cutout formed in the additional electrically conductive layer wherein the cutout encloses an area that completely surrounds the contact pad for avoiding parasitic capacitance between the additional electrically conductive layer and the printed circuit board.

Figure 5:
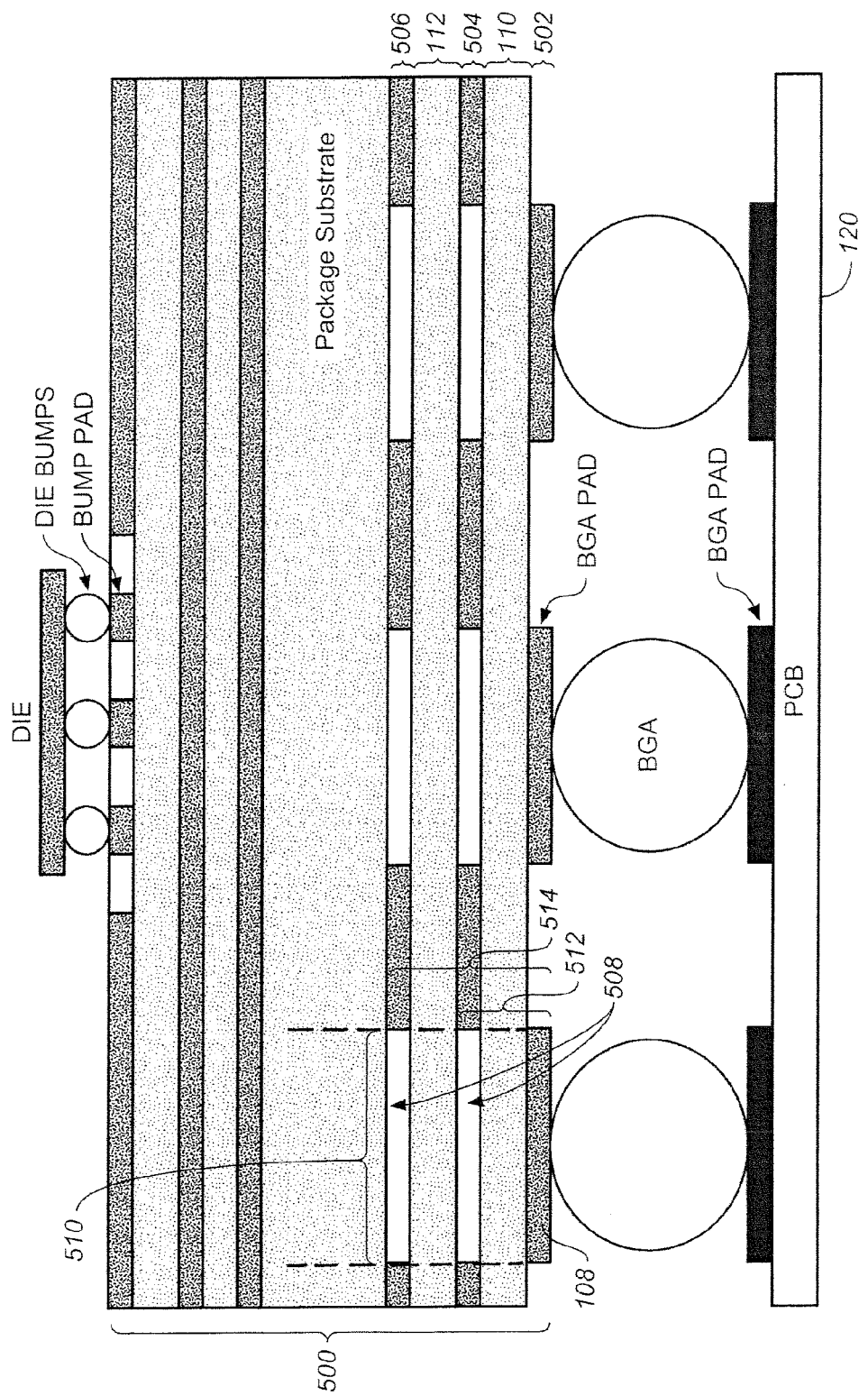
FIG. 5 illustrates a simplified partial side view of an integrated circuit package substrate that includes a cutout formed in a routing metal layer and in a ground metal layer that completely surrounds a contact pad in the contact pad metal layer to reduce parasitic capacitance.

FIG. 5 illustrates a simplified partial side view of an integrated circuit package substrate 500 that includes a cutout formed in a routing metal layer and in a ground metal layer that completely surrounds a contact pad in the contact pad metal layer to reduce parasitic capacitance. Shown in FIG. 5 are a ball pad 108, dielectric layers 110 and 112, vias 118, a printed circuit board 120, a contact pad metal layer 502, a routing metal layer 504, a ground return metal layer 506, cutouts 508, cutout areas 510, and parasitic capacitances 512 and 514.

In the example of FIG. 5, the integrated circuit package substrate 500 may be made in the same manner as in FIG. 1, except that the cutout 508 is formed in the routing metal layer 504 and in the ground return metal layer 506 under the ball pad 108. The cutout 508 may be formed, for example, in the same manner used to remove metal in the routing metal layer 104 around the traces 302 in FIG. 3. The cutout 508 may be included in the floorplan of the integrated circuit design according to well-known techniques to avoid routing conflicts. For example, the cutout area 510 may include a routing trace for connecting a via between the ball pad 108 and the routing metal layer 504.

The cutout 508 encloses the cutout area 510 so that the area enclosed by the ball pad 108 is completely surrounded by the cutout area 510. In other words, there is no overlap between the area enclosed by the ball pad 108 and the metal in the routing metal layer 504 and in the ground return metal layer 506 above the ball pad 108. In one embodiment, the cutout 508 has the same dimensions as the ball pad 108. In other embodiments, the cutout 508 is larger than the ball pad 108. The ball pad 108 may be any type of contact pad used to make electrical connection between the integrated circuit package 500 and a printed circuit board. For example, the ball pad 108 may be a contact used to make electrical connection between the integrated circuit package 500 and a printed circuit board for a ball grid array (BGA) integrated circuit, a flip-chip integrated circuit, a wirebond integrated circuit, a single in-line package, or a micro-chip module. In another embodiment, the ball pad 108 may be an electrically conductive area in any metal layer for which a reduced parasitic capacitance between the metal layer and the printed circuit board is desired.

The dashed lines in FIG. 5 extending upward from the sides of the contact pad 108 enclose the areas of the routing metal layer 504 and the ground return metal layer 506 that are overlapped by the ball pad 108. Because the cutouts 508 completely surround the areas of the routing metal layer 504 and the ground return metal layer 506 that are overlapped by the ball pad 108, the area enclosed by the ball pad 108 does not overlap the metal in the routing metal layer 504 or the ground return metal layer 506. As a result, the parasitic capacitances 512 and 514 are approximately 16 percent or more lower than the parasitic capacitances 114 and 116 in FIG. 1. The reduction in parasitic capacitance advantageously extends the upper frequency limit that may be used to drive the ball pad 108 in the integrated circuit package substrate 500.

In another embodiment, the area enclosed by the ball pad 108 may partially overlap the metal in the routing metal layer 504 or the ground return metal layer 506 to reduce the parasitic capacitances 512 and 514 by a selected minimum limit. For example, the selected minimum limit may be 10 percent less than the parasitic capacitances 114 and 116 in FIG. 1.

In the example of FIG. 5, only three electrically conductive layers are included; however, other embodiments may include a different number of electrically conductive layers. For example, another embodiment may include a 10 layer buildup having contact pads formed in metal layer 10 (M10) and cutouts formed in metal layers M9, M8, M7, and M6. The number of electrically conductive layers in which cutouts are formed depends on the proximity of the additional electrically conductive layers to the first electrically conductive layer. The closer the proximity of the additional electrically conductive layers to the first electrically conductive layer, the greater the number of additional electrically conductive layers that may advantageously include the cutouts to minimize the parasitic capacitance between the contact pads and the other metal layers.

Figure 6:
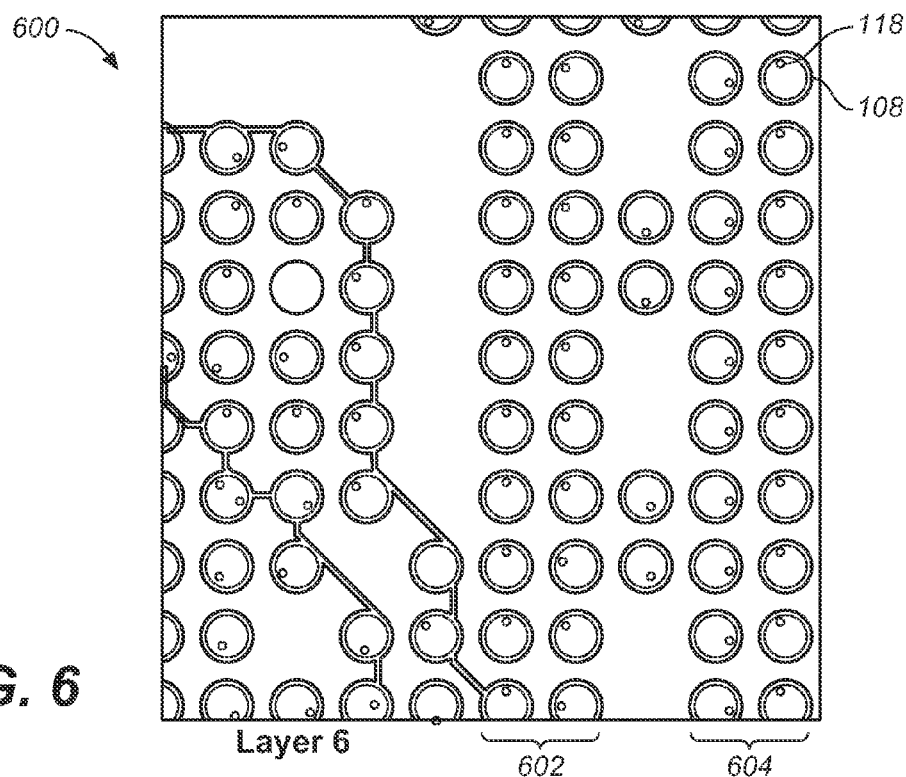
FIG. 6 illustrates a top view of the contact pad metal layer in the integrated circuit package of FIG. 5.

FIG. 6 illustrates a top view 600 of the contact pad metal layer 502 for the integrated circuit package of FIG. 5. Shown in FIG. 6 are ball pads 108, visa 118, transmit (Tx) rows 602, and receive (Rx) rows 604. The contact pad metal layer 502 may be made, for example, in the same manner as the contact pad metal layer 102 in FIG. 1.

Figure 7:
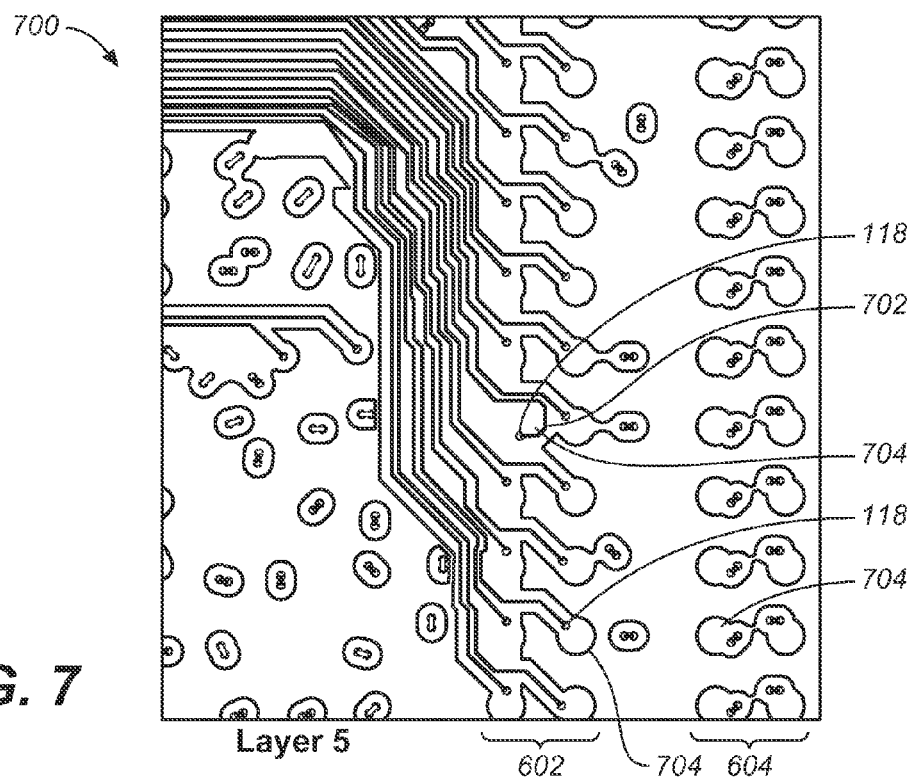
FIG. 7 illustrates a top view of the routing metal layer in the integrated circuit package substrate of FIG. 5.

FIG. 7 illustrates a top view 700 of the routing metal layer 504 in the integrated circuit package substrate of FIG. 5. Shown in FIG. 7 are transmit (Tx) rows 602, receive (Rx) rows 604, routing traces 702, cutouts 704, and vias 118.

In FIG. 7, the vias 118 connect the ball pads 108 in the contact pad metal layer 502 in FIG. 5 to the routing traces 702. In addition to the metal in the routing metal layer 504 that is removed around the routing traces 702, the cutouts 704 completely surround the area enclosed by the ball pads 108 in FIG. 5 constituting the transmit (Tx) rows 602 and the (Rx) rows 604 in FIG. 6, resulting in the reduced parasitic capacitance 512 between the contact pad layer 502 and the routing metal layer 504 in FIG. 5.

Figure 8:
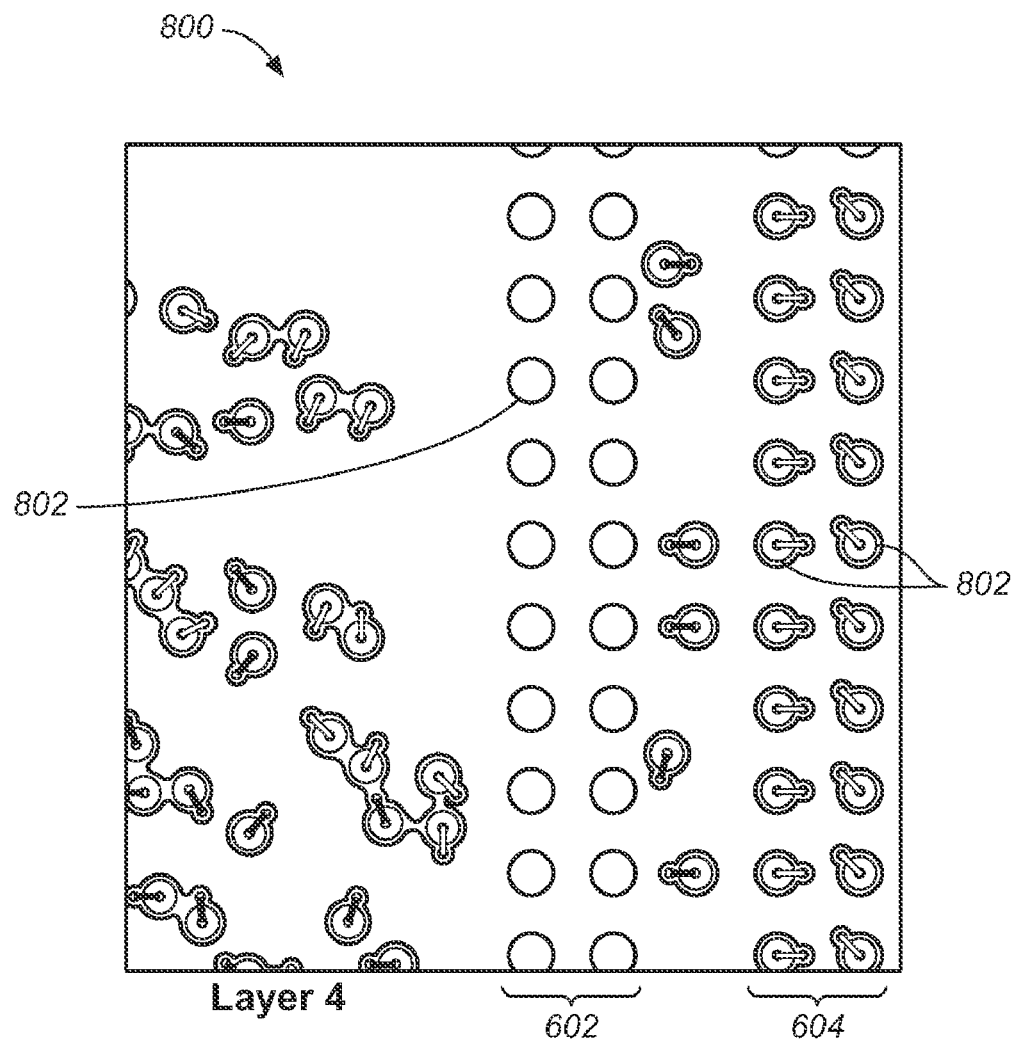
FIG. 8 illustrates a top view of the ground return metal layer in the integrated circuit package substrate of FIG. 5.

FIG. 8 illustrates a top view 800 of the ground return metal layer 506 for the integrated circuit package substrate of FIG. 5. Shown in FIG. 8 are transmit (Tx) rows 602, receive (Rx) rows 604, and cutouts 802.

In FIG. 8, the cutouts 802 completely surround the area enclosed by the ball pads 108 in FIG. 5 constituting the transmit (Tx) rows 602 and the (Rx) rows 604 in FIG. 6, resulting in the reduced parasitic capacitance 514 between the contact pad layer 502 and the ground return metal layer 506 in FIG. 5.

In another embodiment, a method of avoiding parasitic capacitance in an integrated circuit package substrate includes steps of:

(a) forming a first and an additional electrically conductive layer separated from each other by an electrically insulating layer in an integrated circuit package substrate;

(b) forming a contact pad in the first electrically conductive layer for making a direct connection between the integrated circuit package substrate and a printed circuit board; and (c) forming a cutout in the additional electrically conductive layer wherein the cutout encloses an area that completely surrounds the contact pad for avoiding parasitic capacitance between the additional electrically conductive layer and the printed circuit board.

Figure 9:
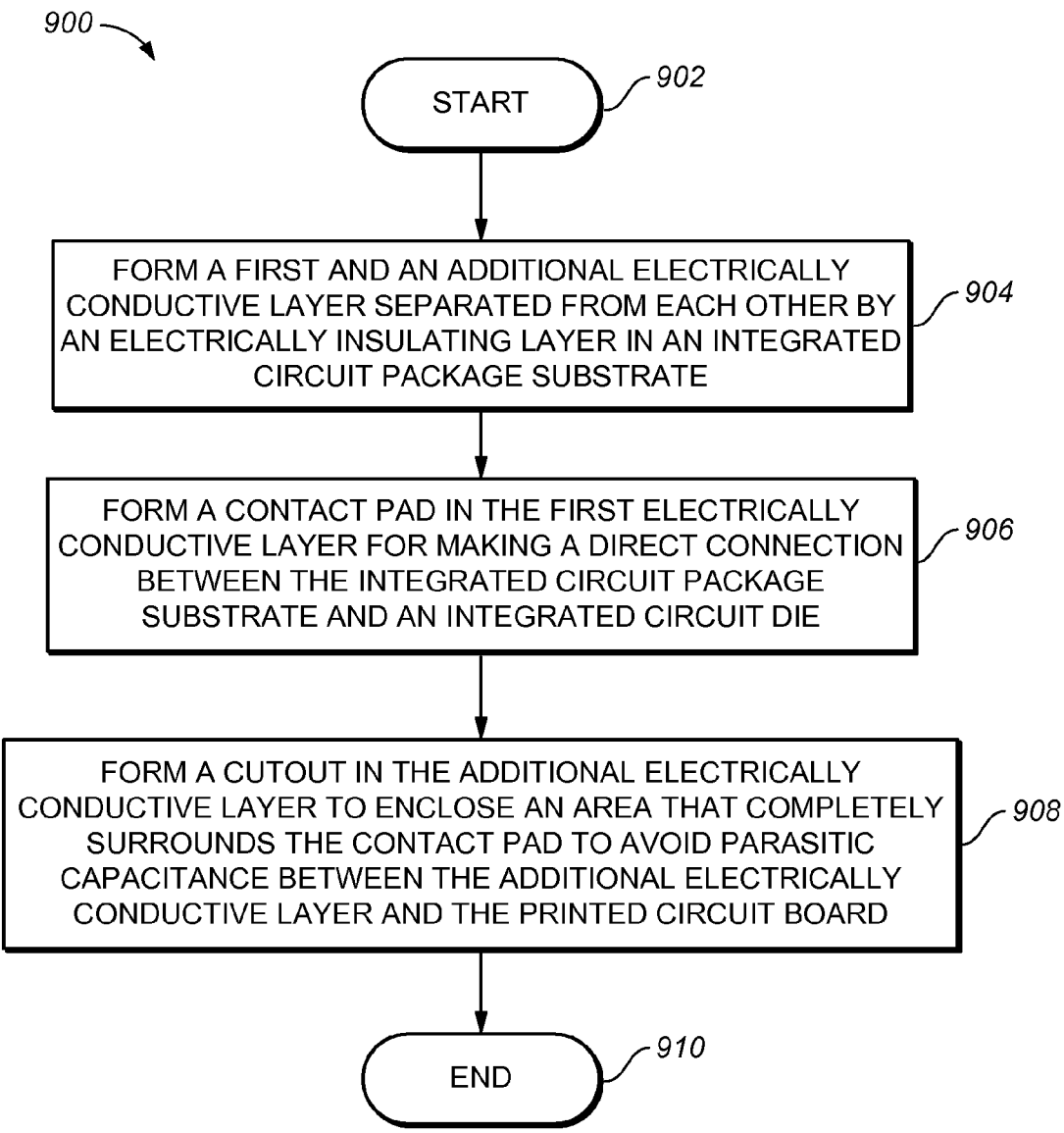
FIG. 9 illustrates a flow chart for a method of avoiding parasitic capacitance in an integrated circuit package substrate.

FIG. 9 illustrates a flow chart for a method of avoiding parasitic capacitance in an integrated circuit package substrate.

Step 902 is the entry point for the flow chart 900.

In step 904, a first and an additional electrically conductive layer separated from each other by an electrically insulating layer are formed in an integrated circuit package substrate according to well-known techniques. For example, the first electrically conductive layer may be a contact pad metal layer.

In step 906, a contact pad is formed in the first electrically conductive layer for making a direct connection between the integrated circuit package substrate and a printed circuit board according to well-known techniques. For example, the contact pad may be a ball pad used to make electrical connection between the integrated circuit package and a printed circuit board for a ball grid array (BGA) integrated circuit, a flip-chip integrated circuit, a wirebond integrated circuit, a single in-line package, or a micro-chip module.

In step 908, a cutout is formed in the additional electrically conductive layer. The cutout encloses an area that completely surrounds the contact pad to avoid parasitic capacitance between the additional electrically conductive layer and the printed circuit board. The additional electrically conductive layer may be, for example, a routing metal layer, a ground return metal layer, or a voltage supply metal layer.

Step 910 is the exit point of the flow chart 900.

Although the flowchart description above is described and shown with reference to specific steps performed in a specific order, these steps may be combined, sub-divided, or reordered without departing from the scope of the claims. Unless specifically indicated, the order and grouping of steps is not a limitation of other embodiments that may lie within the scope of the claims.

The specific embodiments and applications thereof described above are for illustrative purposes only and do not preclude modifications and variations that may be made within the scope of the following claims.

What is claimed is:

1. An integrated circuit package substrate comprising:
a first and a second electrically conductive layer separated from each other by an electrically insulating layer with no intermediate conductive layer therebetween;
a plurality of rows of contact pads formed in the first electrically conductive layer for making a direct connection between the integrated circuit package substrate and a printed circuit board; and
a plurality of cutouts formed in the second electrically conductive layer for reducing parasitic capacitance between the second electrically conductive layer and the first electrically conductive layer, wherein each cutout encloses an electrically insulating area within the second electrically conductive layer, and wherein each electrically insulating area completely overlaps a corresponding one of the contact pads formed in the first electrically conductive layer such that there is substantially no overlap of the rows of contact pads with metal in the second electrically conductive layer.

2. The integrated circuit package substrate of claim 1 further comprising transmit and receive rows of ball pads as the contact pads operable with the second electrically conductive layer for converting a serial data stream to or from a parallel data stream, the second electrically conductive layer being a routing layer including routing traces, the cutouts being arranged in rows corresponding to the rows of ball pads.

3. The integrated circuit package substrate of claim 1 wherein the cutouts have the same dimensions as the contact pads.

4. The integrated circuit package substrate of claim 1, further comprising a third electrically conductive layer separated from the second electrically conductive layer by a second electrically insulating layer, the third electrically conductive layer including a plurality of cutouts each of which encloses an electrically insulating area and completely overlaps one of the contact pads, the contact pads forming transmit and receive rows, the cutouts in the second and third electrically conductive layers being arranged in rows corresponding to the transmit and receive rows such that there is substantially no overlap of the rows of contact pads with metal in the third electrically conductive layer.

5. The integrated circuit package substrate of claim 4, wherein the second electrically conductive layer comprises a routing layer electrically connected with the first electrically conductive layer and wherein the third electrically conductive layer comprises a ground return metal layer.

6. The integrated circuit package substrate of claim 1, wherein the second electrically conductive layer comprises a routing layer electrically connected with the first electrically conductive layer, the cutouts being arranged in rows corresponding to and aligned with the rows of contact pads.

7. An integrated circuit package substrate, comprising:
   a first layer comprising a plurality of rows of electrical contacts;
   a routing metal layer comprising a plurality of routing traces, the electrical contacts in the first layer being electrically connected with the respective routing traces;
   a dielectric layer between the first layer and the routing metal layer with no intermediate conductive layer therebetween; and
   a plurality of cutouts in the routing metal layer for reducing parasitic capacitance between the first layer and the routing metal layer, the cutouts respectively overlapping the electrical contacts and having the same or larger dimensions as the electrical contacts such that there is substantially no overlap of the rows of contact pads with metal in the routing metal layer.

8. The integrated circuit package substrate of claim 7, wherein the cutouts are arranged in rows corresponding to the rows of electrical contacts, each of the cutouts completely overlapping a corresponding one of the electrical contacts.

9. The integrated circuit package substrate of claim 8, further comprising a ground return metal layer and a second dielectric layer between the routing metal layer and the ground return metal layer, the ground return metal layer including a plurality of cutouts respectively overlapping the electrical contacts for reducing parasitic capacitance between the first layer and the ground return metal layer such that there is substantially no overlap of the rows of contact pads with metal in the ground return metal layer.

10. The integrated circuit package substrate of claim 8, wherein the rows of electrical contacts include transmit rows and receive rows operable with the routing metal layer for converting a serial data stream to or from a parallel data stream.

11. The integrated circuit package substrate of claim 8, wherein the electrical contacts are ball pads having the same dimensions as the cutouts.

12. An integrated circuit package substrate, comprising:
    a first layer comprising a plurality of rows of electrical contacts;
    a plurality of electrically conductive layers disposed immediately proximate the first layer;
    a plurality of dielectric layers separating, respectively, the electrically conductive layers and the first layer from each other, and
    a plurality of rows of cutouts formed in each of the plurality of the electrically conductive layers, each of the cutouts overlapping a corresponding one of the electrical contacts for reducing parasitic capacitance between the electrically conductive layers and the first layer such that there is substantially no overlap of the rows of electrical contacts with metal in the plurality of electrically conductive layers.

13. The integrated circuit package substrate of claim 12, wherein each of the cutouts completely overlaps a corresponding one of the electrical contacts.

14. The integrated circuit package substrate of claim 13, wherein the electrically conductive layers comprise at least a ground return metal layer and a routing metal layer, the routing metal layer comprising a plurality of routing traces, the electrical contacts in the first layer being electrically connected with the respective routing traces using electrically conductive vias.

15. The integrated circuit package substrate of claim 14, wherein each of the cutouts has the same or larger dimensions as a corresponding electrical contact with which it overlaps.

16. The integrated circuit package substrate of claim 12, wherein the electrical contacts comprise transmit rows and receive rows, and the electrically conductive layers are operable to convert a serial data stream to or from a parallel data stream.

17. The integrated circuit package substrate of claim 16, wherein each cutout completely overlaps a corresponding one of the electrical contacts.

18. The integrated circuit package of claim 16, wherein the electrical contacts comprise ball pads, the cutouts having the same dimensions as the ball pads.

19. The integrated circuit package substrate of claim 18, further comprising a plurality of vias electrically connected, respectively, to the ball pads and routing traces within the cutouts for respectively connecting the vias to one of the electrically conductive layers.

* * * * *